(12) United States Patent
Kapoor et al.

(10) Patent No.: US 9,860,975 B2
(45) Date of Patent: Jan. 2, 2018

(54) THERMAL RELIEF PAD

(71) Applicant: HEWLETT PACKARD ENTERPRISE DEVELOPMENT LP, Houston, TX (US)

(72) Inventors: Mark Vinod Kapoor, Houston, TX (US); David W. Engler, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/109,177

(22) PCT Filed: Jan. 30, 2014

(86) PCT No.: PCT/US2014/013785
§ 371 (c)(1),
(2) Date: Jun. 30, 2016

(87) PCT Pub. No.: WO2015/116090
PCT Pub. Date: Aug. 6, 2015

(65) Prior Publication Data
US 2016/0330832 A1    Nov. 10, 2016

(51) Int. Cl.
*H05K 1/03* (2006.01)
*H05K 1/02* (2006.01)
*H05K 1/11* (2006.01)

(52) U.S. Cl.
CPC ........ *H05K 1/0271* (2013.01); *H05K 1/0209* (2013.01); *H05K 1/0228* (2013.01);
(Continued)

(58) Field of Classification Search
CPC ... H05K 1/00; H05K 1/02; H05K 1/11; H05K 1/16; H05K 3/34; H05K 3/40; H01L 23/28; H01L 23/31; H01L 23/48
(Continued)

(56) References Cited

U.S. PATENT DOCUMENTS 4,881,906 A * 11/1989 Mackanic ............ H01R 12/526
29/843
5,363,280 A * 11/1994 Chobot ................ H05K 1/0201
174/266

(Continued)

FOREIGN PATENT DOCUMENTS

JP    05-291746    11/1993
JP    2007042995    2/2007

OTHER PUBLICATIONS

International Searching Authority, The International Search Report and the Written Opinion, dated Oct. 27, 2014, 10 Pages.
(Continued)

*Primary Examiner* — Xiaoliang Chen
(74) *Attorney, Agent, or Firm* — Hewlett Packard Enterprise Patent Development

(57) ABSTRACT

A printed circuit board (PCB) having a thermal relief pad around at least one via. The thermal relief pad includes at least four thermal cut-outs and at least four conductive bands. The at least four conductive bands are formed between the at least four thermal cut-outs such that adjacent conductive pads are orthogonal to each other. Each pair of mutually opposite conductive bands have substantially equal lengths and each pair of adjacent conductive bands have unequal lengths.

12 Claims, 2 Drawing Sheets

(52) U.S. Cl.
CPC ........... *H05K 1/0243* (2013.01); *H05K 1/116* (2013.01); *H05K 2201/10159* (2013.01); *H05K 2201/10189* (2013.01)

(58) Field of Classification Search
USPC ....... 174/255, 250, 252, 257, 260, 262, 266; 361/693, 736, 748, 794, 813
See application file for complete search history.

(56) References Cited

U.S. PATENT DOCUMENTS

| | | | | |
|---|---|---|---|---|
| 5,451,720 A * | 9/1995 | Estes | ................... | H05K 1/0201 174/250 |
| 5,473,813 A | 12/1995 | Chobot et al. | | |
| 6,235,994 B1 * | 5/2001 | Chamberlin | ......... | H05K 1/0201 174/252 |
| 6,486,414 B2 * | 11/2002 | Kobayashi | ........... | H05K 1/0222 174/255 |
| 6,597,059 B1 * | 7/2003 | McCann | ............. | H01L 23/3114 257/673 |
| 6,646,886 B1 * | 11/2003 | Popovich | ............. | H05K 1/0265 174/255 |
| 7,016,200 B2 * | 3/2006 | Schmid | .................. | H05K 1/116 174/252 |
| 7,554,040 B2 * | 6/2009 | Nakao | .................... | B23K 1/085 174/260 |
| 8,106,303 B2 * | 1/2012 | Ishida | .................. | H05K 1/0201 174/252 |
| 8,464,200 B1 * | 6/2013 | Christo | ............... | G06F 17/5068 716/132 |
| 8,566,773 B2 * | 10/2013 | Christo | ............... | G06F 17/5081 361/748 |
| 8,610,254 B2 | 12/2013 | Zhao | | |
| 2007/0079275 A1 * | 4/2007 | Kang | .................. | G06F 17/5068 716/110 |
| 2009/0008768 A1 * | 1/2009 | Alabin | ................ | H01L 23/3735 257/693 |
| 2011/0000707 A1 * | 1/2011 | Kawai | .................. | H05K 1/0224 174/266 |

OTHER PUBLICATIONS

McMorrow, S.; "Advances in High Speed PCB design for layout professional"; Oct. 4, 2004; 104 pages.
Semtech; "RF Design Guidelines: PCB Layout and Circuit Optimization"; Nov. 7, 2007; 22 pages.
Zhang, H.J.; "PCB Layout Considerations for Non-Isolated Switching Power Supplies"; Jun. 2012; 14 pages.

* cited by examiner

THERMAL RELIEF PAD

BACKGROUND

Generally printed circuit boards (PCBs) include multiple conductive layers and insulating layers. The conductive layers have conductive paths or traces which provide electrical connections between components mounted on the PCB. Of the many conductive layers, the PCB may further include dedicated power layers and dedicated electric ground layers. A plurality of through-holes or vias is drilled through the conductive layers for mounting the components on the PCB. Some of the vias provide a connection to the dedicated power and electric ground layers.

BRIEF DESCRIPTION OF FIGURES

The detailed description is provided with reference to the accompanying figures. In the figures, the left-most digit(s) of a reference number identifies the figure in which the reference number first appears. The same numbers are used throughout the figures to reference like features and components.

DETAILED DESCRIPTION

Figure 1A:
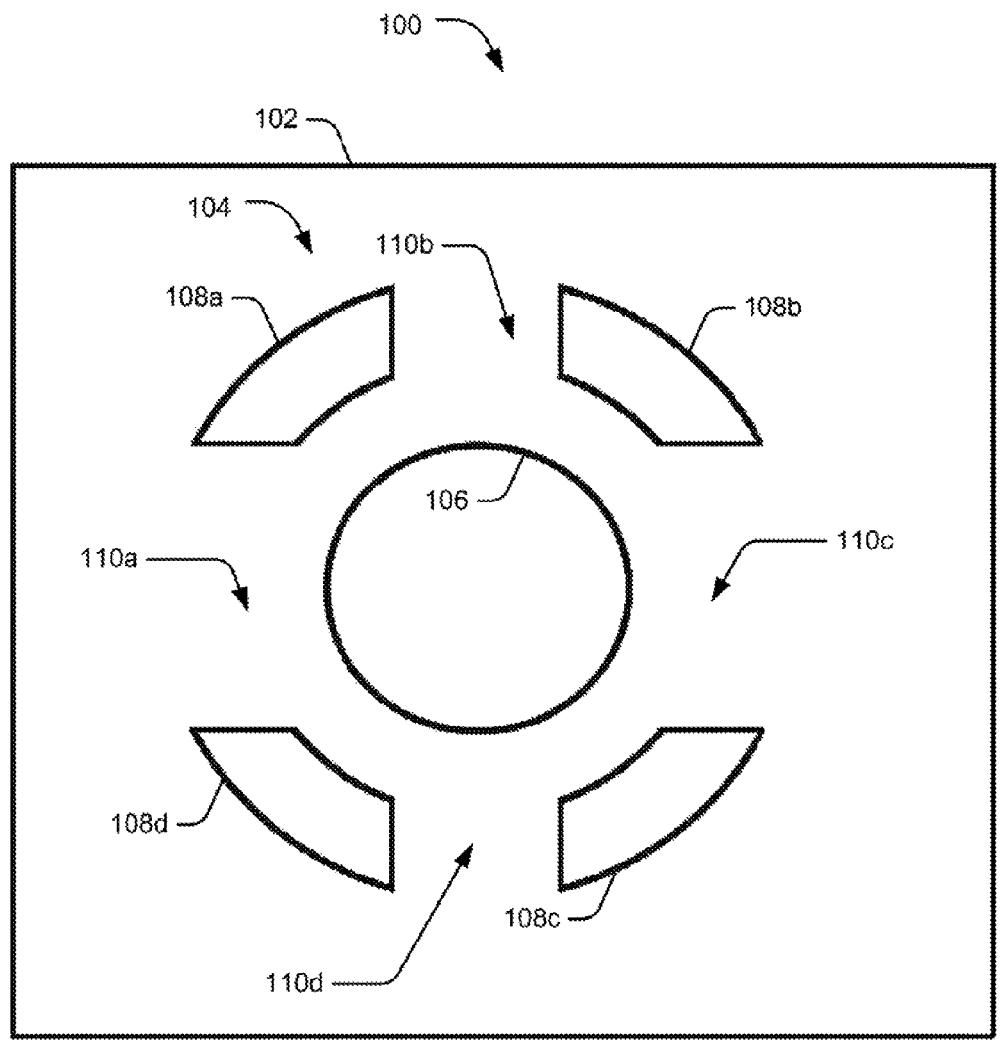
FIGS. 1a and 1b illustrate a plan view of a portion of a printed circuit board employing a thermal relief pad, in accordance with principles of the present subject matter.

Generally, printed circuit boards (PCBs) are designed as multilayer PCBs. Such PCBs may include a plurality of conductive layers and a plurality of insulating layers arranged alternatively, with one layer sandwiched between the other two layers. Of the plurality of conductive layers, some of the conductive layers may be employed for providing input power to components mounted on the PCB, and some other conductive layers may be employed for providing an electric ground to the components mounted on the PCB. The power layers and the ground layers are referred to as power planes and ground planes, respectively. The power and the ground planes in turn are collectively referred to as reference planes. Typically, the reference planes are arranged in between the conductive layers onto which the components are mounted and the insulating layers, and are spaced such that layer-to-layer crosstalk is minimized.

The PCB may further include a plurality of conductive paths, or traces etched on the conductive layers which provide electrical connections between the components mounted on the PCB. The components may be electrical components or electronic-based components. To mount the components on the PCB, a plurality of through-holes or vias may be provided on the PCB. The vias may pass through and connect different conductive layers and the reference planes. The vias in turn may be surrounded by solder pads. Subsequently, leads of the components may be placed on the vias and may be soldered to the PCB to make electrical connections between the components and the reference planes, and between the components and the conductive layers. In this manner, the vias connect the plurality of conductive layers and reference planes with the components.

The reference plane is typically a solid layer of conductive metal, such as copper. Since a solid layer of a conductive material has a high thermal conductivity, during soldering, the reference plane acts as an efficient heat sink and therefore dissipates the soldering heat at a faster rate. Therefore, the solder solidifies unevenly causing a "cold solder joint". Such cold solder joints offer relatively high resistance and poor mechanical strength. The improper soldering results in poor electrical connections and also provides poor support to the components on the PCB.

To prevent such cold solder joints, thermal relief pads are provided around each. The solder pad is typically a shape of copper used for mounting components on the PCB through the via. The thermal relief pad is a pad typically created by using a chemical etching process on the PCB around the via. The thermal relief pad may be connected with the reference plane through narrow tracks disposed in a region of the via passing through the reference plane. As such, the thermal relief pad is not directly connected with the reference plane, thereby minimizing heat transfer to the reference plane during soldering. The thermal relief pad therefore provides a thermal isolation between the reference planes near the vias and the conductive layers which are provided further away from the vias.

Typically, the thermal relief pad is composed of a plurality of conductive bands and thermal cut-out. The conductive bands are formed during the chemical etching of the PCB that exposes selective portions of conductive metal of PCB. Similarly, the thermal cut-out are formed by removing selected portions of conductive metal of the PCB. The thermal cut-outs in turn inhibit electrical connection between the via and the reference plane. The shape of the thermal cut-out typically provides a path of lower thermal conduction which reduces the heat dissipation during soldering. In one example, the thermal relief pad may include four equal length arc shaped thermal cut-out positioned about a central point. In another example, the thermal relief pad may include two equal length semi-circle shaped thermal cut-outs positioned about a central point.

In operation, when signal or current, hereinafter used interchangeably, of low speed is sent from a source through a trace on the PCB to a destination, an equal and opposite current flows from the destination to the source. It may be understood that current flows in a loop and therefore the current that flows from the destination to the source is termed as return current. At low speed, the return current follows a path of lower resistance and therefore returns to the source through the reference plane. Typically, the return current through the via connecting the reference plane follows the path of least resistance through the conductive bands provided by the thermal relief pad. Accordingly, a length of the conductive bands is kept smaller than a length of the thermal cut-outs in a direction parallel to a direction of return current to the reference plane. In contrast, when high speed signal is sent from the source through the trace on the PCB, the return current follows a path of least inductance. The least inductance path lies on the reference plane directly below the trace minimizing a total loop area between a signal path and the returning current path. Therefore, the high speed return current returns to the source through this least inductance path.

However, the larger length of thermal cut-outs impedes the reference plane thereby causing impedance discontinuities in traces adjacent to the thermal relief pad. As a result, crosstalk and electromagnetic interference (EMI) between high speed signal flowing through the trace and high speed return current are created. Also, due to the larger length of the thermal cuts-outs in the direction of the return current, a spacing of smaller length is provided between the thermal relief pad and a nearby trace. As such, due to the reflection of the high speed return current, the high speed signals flowing through the trace may lose signal strength resulting in poor functionality of the PCB.

A thermal relief pad is provided, according to an example of the present subject matter. The thermal relief pad as described herein may provide a path of lower inductance for a return current to a reference plane in a printed circuit board (PCB) employed for high speed data. Examples of such PCBs employing high speed signal may include double data rate synchronous dynamic random-access memory (e.g., DDR4 SDRAM), Peripheral Component Interconnect Express (PCIe), or other appropriate PCBs.

In an example, the thermal relief pad may include a plurality of thermal cut-outs and a plurality of conductive bands. The plurality of conductive bands is formed between the plurality of thermal cut-outs such that the plurality of thermal cut-outs and the plurality of conductive bands are arranged alternatively. Also, the plurality of conductive bands are arranged orthogonally to each other such that a pair of mutually opposite conductive bands have equal lengths and a pair of adjacent conductive bands in the orthogonal arrangement have unequal lengths. It may be understood that the length of the conductive band is referred to as spoke width. As described earlier, shape of the thermal cut-out provides a path of lower thermal conduction which reduces the heat dissipation to a reference plane during soldering. As such, each of the plurality of thermal cut-outs, according to one example, is arc shaped and is positioned about a central point in the thermal relief pad.

Further, the thermal relief pad may be formed such that a pair of mutually opposite conductive bands are placed in a direction parallel to direction of return current through a via or a connector pin in parallel to a trace carrying high speed signals. Another pair of mutually opposite conductive bands is placed in a direction perpendicular to the direction of return current to the reference plane. Further, the length of the conductive bands are created such that a length of pair of mutually opposite conductive bands in a direction perpendicular to a direction of return current to a reference plane is greater than a length of pair of mutually opposite conductive bands in a direction parallel to the direction of return current to the reference plane. Also, the thermal cut-outs have equal lengths which are lesser than the length of the pair of mutually opposite conductive bands in the direction perpendicular to a direction of return current to a reference plane. Thus, the length of the pair of mutually opposite conductive bands in the direction parallel to the direction of return current to the reference plane provide a path of lower inductance in a direction parallel to the direction of return current to the reference plane though the via.

Further, the decreased length of thermal cut-outs compared to the length of conductive bands may increase the reference plane around a trace adjacent to the thermal relief pad. This removes discontinuities in the reference plane near the trace, thereby reducing impedance discontinuities on the trace and improving signal integrity of the return current. Therefore, the return current is prevented from coupling with the high speed signals flowing through the traces as the return current is no longer reflected from the thermal cut-outs and flows through the path of lower inductance.

Further, the increased length of the pair of mutually opposite conductive bands in the direction perpendicular to the direction of the return current to the reference plane through the via may increase a distance between two traces passing between adjacent vias. This prevents the coupling of the high speed signals flowing through the two traces. Therefore, the signal strength of the high speed signals is not deteriorated.

Also, the increased length of the pair of mutually opposite conductive bands in the direction perpendicular to the direction of the return current to the reference plane through the via may increase a spacing between the thermal relief pad and a corresponding trace nearest to the via. This prevents the coupling of the reflected high speed return current with the high speed signals flowing through the nearest trace. Therefore, the signal strength of the high speed signals is not deteriorated.

Furthermore, the increased length of the pair of mutually opposite conductive bands in the direction perpendicular to the direction of the return current to the reference plane through the via may increase an area of reference plane continuity between two adjacent thermal relief pads. It may be understood that the area of reference plane continuity is an area between two adjacent vias projected on the reference plane. The area of reference plane continuity limits the area between two adjacent vias for ensuring the signals flowing through the vias are not coupled with each other. The increased area of reference plane continuity therefore effectively reduces coupling between the high speed signals flowing through adjacent vias. Also, the increased area of reference plane continuity may allow electrical fields generated by flowing of high speed signals flowing through the traces adjacent to the vias to couple with themselves. This reduces coupling of the high speed signals with the return current thereby improving noise margin of the components on the PCB.

Also, placement of additional vias near the traces is eliminated due to the path of lower impedance provided by the pair of mutually opposite conduction bands in the direction parallel to the direction of return current through the via. As such additional space on the PCB is freed and may be used for other purposes, such as augmenting trace routes.

Figure 1B:
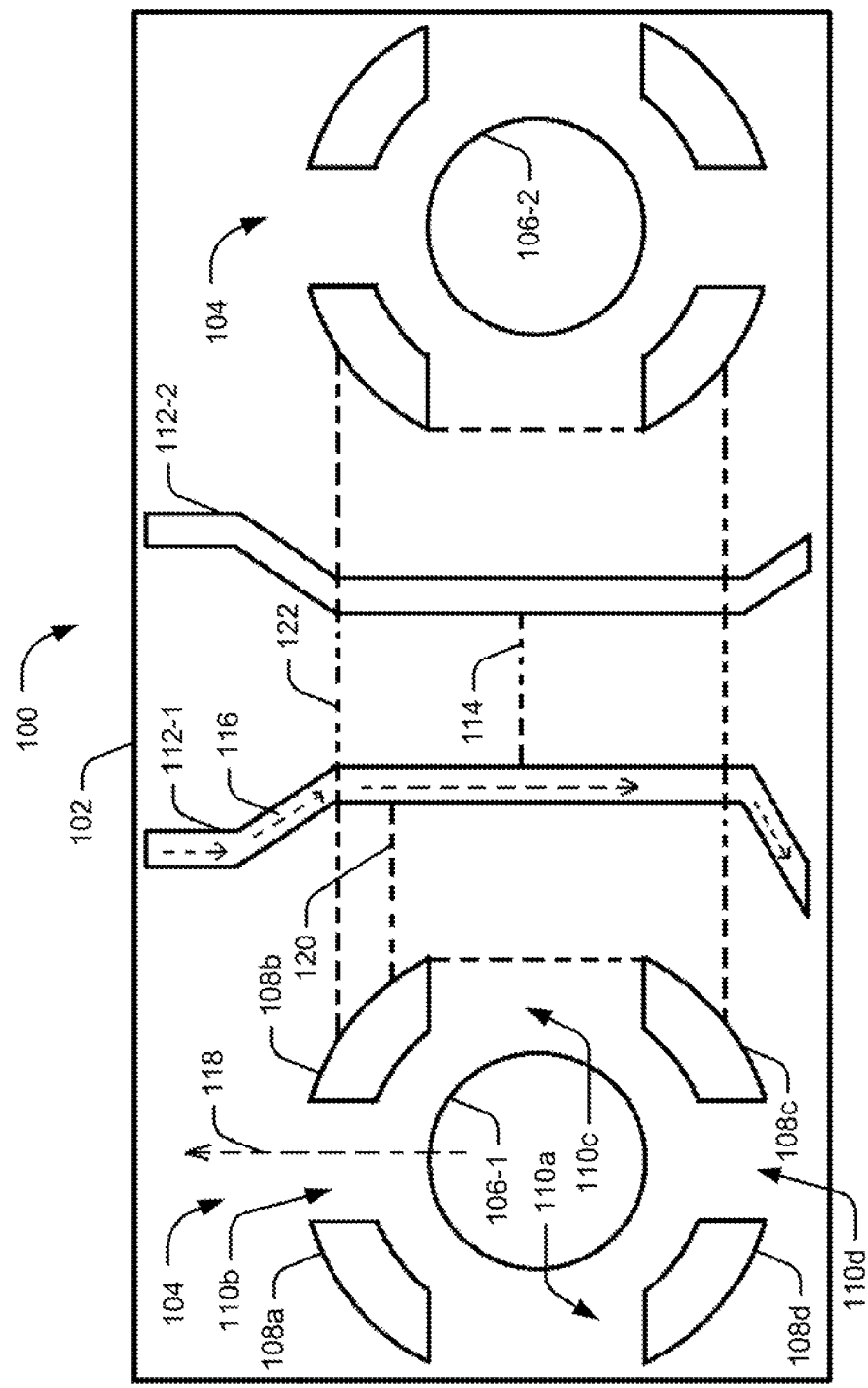

The manner in which the thermal relief pad may be implemented shall be explained in detail with respect to FIGS. 1a and 1b. The aspects of the thermal relief pad are described in the context of the following example thermal relief pad.

It should be noted that the description and figures merely illustrate the principles of the present subject matter. It will thus be appreciated that various arrangements that embody the principles of the present subject matter, although not explicitly described or shown herein, can be devised from the description and are included within its scope. Moreover, all statements herein reciting principles and aspects of the present subject matter, as well as specific examples thereof, are intended to encompass equivalents thereof.

FIG. 1a illustrates a plan view of a portion of a printed circuit board (PCB) 100 employed for high speed data and employing a thermal relief pad, in accordance with one example of the present subject matter. Examples of such PCB 100 include double data rate fourth rate synchronous dynamic random-access memory (DDR4 SDRAM) and Peripheral Component Interconnect Express (PCIe).

The PCB 100 includes a plurality of conductive layers and a plurality of insulation layers arranged alternatively. For simplicity, a portion of a topmost conductive layer 102 onto which components are mounted is shown in the figure. Typically, some of the conductive layers from the plurality of conductive layers are dedicated for providing power to components mounted on the PCB and some of other conductive layers are dedicated for providing electric ground to components mounted on the PCB. Typically, the power planes provide multiple voltage levels to the components, such as a +12 Volt power plane, a −12 Volt power plane, and a +5 Volt power plane. The power layers and the ground layers are referred to as power planes and ground planes, respectively. The power and the ground planes in turn are collectively referred to as reference planes.

In an example, the conductive layer 102 may include a thermal relief pad 104 located around a via 106. The via 106 may provide a connection with the plurality of conductive layers and the reference planes. The thermal relief pad 104 around the via 106 may include a plurality of thermal cut-outs 108a, 108b, 108c, and 108d, and a plurality of conductive bands 110a, 110b, 110c, and 110d. The thermal relief pad 104 may be created on the conductive layer 102 such that the plurality of conductive bands 110a, 110b, 110c, and 110d are formed in between the plurality of thermal cut-outs 108a, 108b, 108c, and 108d. As described earlier, the thermal relief pad 104 may be created on the conductive layer 102 using a chemical etching process. The thermal relief pad 104 may provide thermal isolation between the via 106 and a reference plane through which the via 106 is passing.

Further, the plurality of conductive bands 110a, 110b, 110c, and 110d may be arranged orthogonally to each other in between the plurality of thermal cut-outs 108a, 108b, 108c, and 108d. Accordingly, a pair of mutually opposite conductive bands 110b and 110d are placed in a direction parallel to direction of return current though the via 106 or in parallel to a trace (not shown in the figure) carrying high speed signal. Another pair of mutually opposite conductive bands 110a and 110c are placed in a direction perpendicular to the direction of return current to the reference plane.

Further, each pair of mutually opposite conductive bands 110a and 110c, and 110b and 110d in the orthogonal arrangement have substantially equal lengths. Also, each pair of adjacent conductive bands 110a and 110b, and 110c and 110d in the orthogonal arrangement have unequal lengths such that the length of pair of mutually opposite conductive bands 110a and 110c in a direction perpendicular to the direction of the return current to a reference plane is greater than the length of pair of mutually opposite conductive bands 110b and 110d in a direction parallel to the direction of the return current to a reference plane.

Further, as described earlier, shape of the thermal cut-outs provide a path of lower thermal conduction which reduces the heat dissipation to a reference plane during soldering. Accordingly, in an example, each of the thermal cut-outs 108a, 108b, 108c, and 108d may be shaped as a convex arc. Also, each such arch shaped thermal cut-outs 108a, 108b, 108c, and 108d is positioned about a central point in the thermal relief pad 104. Additionally, the length of the each such arch shaped thermal cut-outs 108a, 108b, 108c, and 108d is smaller than the length of pair of mutually opposite conductive bands 110a and 110c in the direction perpendicular to the direction of the return current to the reference plane.

Further, the length of pair of mutually opposite conductive bands 110b and 110d in the direction parallel to the direction of the return current to the reference plane provides a path of lower inductance though them. As described earlier, the return current follows a lower inductance path provided on a reference plane directly below a trace when high speed signals flow through the trace. Thus, the thermal relief pad 104 allows the return current to follow the lower inductance path and thereby reduce electromagnetic interference (EMI) and cross talk between the return current passing through the reference plane below the trace and high speed signals passing through the trace on the conductive layer 102. Further, due to the lower inductance path, the return current does not couple with high speed signals flowing through nearby traces thereby improving the noise margin of the components on the PCB 100.

It may be understood that the thermal relief pad is dependent on an end application of the PCB, such as high speed data transfer and the length of the pair of mutually opposite conductive bands 110a and 110c in the direction perpendicular to the direction of return current may vary accordingly. In an example of thermal relief pad positioned adjacent to traces carrying high speed signals, the length of the pair of mutually opposite conductive bands in the direction perpendicular to the direction of the return current to the reference plane may be maintained at 25 mils and the length of the pair of mutually opposite conductive bands in the direction parallel to the direction of the return current to the reference plane may be maintained at 8 mils. In another example of a thermal relief pad connecting to a power plane, the length of the pair of mutually opposite conductive bands in the direction perpendicular to the direction of the return current to the reference plane may be maintained at 10 mils and the length of the pair of mutually opposite conductive bands in the direction parallel to the direction of the return current to the reference plane may be maintained at 5 mils.

Furthermore, as the geometry of the thermal relief pad 104 provides a localized path of lower inductance for the return current through the via 106, creation of additional vias for providing the localized path is eliminated. Examples of such additional vias include stitching vias, differential vias, and stitching vias with bypass capacitor. Also, the elimination of additional vias from the PCB 100 provides an additional space on the PCB 100 that can be used for other purposes, such as augmenting trace routes on the PCB 100.

FIG. 1b illustrates an expanded view of the portion of the PCB 100, in accordance with one example of the present subject matter. The conductive layer 102 in the PCB 100 may further include a plurality of conductive paths or traces, 112-1, 112-2, ..., 112-N, for providing electrical connections between the components mounted on the conductive layer 102. For simplicity, two traces 112-1 and 112-2 are shown in the figure. The plurality of traces 112-1, 112-2, ..., 112-N, can be collectively referred to as traces 112, and individually referred to as a trace 112 hereinafter. The traces 112 may be created on the conductive layer 102 by chemically etching the conductive layer 102 according to a PCB design. In one example, the traces 112 may be created on other conductive layers according to the PCB design.

The conductive layer 102 may further include a plurality of vias, 106-1, 106-2, ..., 106-N arranged according to a placement of the components in a PCB design on the PCB 100. For simplicity, two vias 106-1 and 106-2 are shown in the figure. The plurality of vias, 106-1, 106-2, ..., 106-N, can be collectively referred to as vias 106, and individually referred to as a via 106 hereinafter. The vias 106 may pass through the plurality of conductive layers and through the reference planes according to the PCB design indicating the electrical connections designed between the reference planes and the conductive layers.

In an example, the vias 106-1 and 106-2 may be surrounded by thermal relief pad 104 and the traces 112-1 and 112-2 may be placed adjacent to the vias 106-1 and 106-2. As described earlier, the increased length of pair of mutually opposite conductive bands 110a and 110c of the thermal relief pad 104 in the direction perpendicular to the direction of the return current to the reference plane around the vias 106-1 and 106-2 may increase a distance 114 between the traces 112-1 and 112-2 adjacent to the vias 106-1 and 106-2. The increased distance 114 between the traces 112-1 and 112-2 adjacent to the vias 106-1 and 106-2 may prevent the high speed signals travelling through the traces 112-1 and 112-2 from coupling with each other, thereby reducing crosstalk and EMI between the high speed signals. In an example, when high speed signal 116 passes through the trace 112-1, then a return current 118 passes through the path of lower inductance provided by the smaller length of the pair of mutually opposite conductive bands 110b and 110d of the thermal relief pad 104 in the direction parallel to the trace 112-1.

Further, the increased length of the pair of mutually opposite conductive bands 110a and 110c of the thermal relief pad 104 in the direction perpendicular to the direction of the return current to the reference plane may reduce a length of the thermal cut-outs 108a, 108b, 108c, and 108d. The reduced length of the thermal cut-outs 108a, 108b, 108c, and 108d consequently may increase a spacing 120 between the thermal cut-out 108a, 108b, 108c, and 108d and the traces 112-1 and 112-2 near to the vias 106-1 and 106-2. The increased spacing 120 may prevent impedance discontinuities and electric field distortion between the traces 112-1 and 112-2, and the thermal cut-outs 108a, 108b, 108c, and 108d, thereby preventing reflections of the high speed signals passing through the traces 112-1 and 112-2. As such, signal strength of the high speed signals may be maintained until the high speed signals reach a destination, such as other electrical component on the PCB 100.

Furthermore, the increased length of the increased length of the pair of mutually opposite conductive bands 110a and 110c of the thermal relief pad 104 in the direction perpendicular to the direction of the return current to the reference plane may increase a reference plane area 122 between the adjacent vias 106-1 and 106-2. As described earlier the reference plane area 122 is an area between two adjacent thermal relief pads 104 projected on the reference plane below the traces. The increased reference plane area 122 may reduce a coupling between the high speed signals passing through the traces 112-1 and 112-2 and the vias 106-1 and 106-2. Therefore, EMI and crosstalk between the adjacent vias 106-1 and 106-2 are considerably reduced.

Although example of the thermal relief pad is described in language specific to structural features, it is to be understood that the appended claims are not necessarily limited to the specific features described. Rather, the specific features and methods are disclosed as example of the thermal relief pad.

We claim:

1. A printed circuit board (PCB) having a thermal relief pad around at least one via, the thermal relief pad comprising:
   at least four thermal cut-outs; and
   at least four conductive bands formed between the at least four thermal cut-outs, wherein:
      the adjacent conductive bands from amongst the at least four conductive bands are orthogonal to each other and have unequal lengths, and
      each pair of mutually opposite conductive bands have substantially equal lengths;
      wherein a length of a pair of mutually opposite conductive bands in a direction perpendicular to a direction of a return current to at least one reference plane is greater than a length of a pair of mutually opposite conductive bands in a direction parallel to the direction of the return current to the at least one reference plane.

2. The PCB as claimed in claim 1, wherein the length of the pair of mutually opposite conductive bands in the direction parallel to the direction of the return current to the at least one reference plane provides a path of lower conductance for the return current.

3. The PCB as claimed in claim 1, wherein the at least one reference plane is indicative of one of a power plane and a ground plane.

4. The PCB as claimed in claim 1, wherein the at least four thermal cut-outs are convex shaped having equal lengths and wherein the at least four thermal cut-outs are positioned about a central point in the thermal relief pad.

5. The PCB as claimed in claim 1 further comprises:
   a plurality of conductive layers, wherein the at least one via passes through at least one conductive layer and the at least one reference plane; and
   a plurality of traces defining an electrical path between a plurality of components mountable on the at least one conductive layer through the at least one via surrounded by the thermal relief pad.

6. The PCB as claimed in claim 5, wherein the at least one via passes through the at least one conductive layer and the at least one reference plane.

7. The PCB as claimed in claim 5, wherein a distance between at least two traces adjacent to the thermal relief pad is increased based on the length of the pair of mutually opposite conductive bands in the direction perpendicular to the direction of the return current to the at least one reference plane.

8. The PCB as claimed in claim 5, wherein a spacing between the thermal relief pad and at least one trace adjacent to the thermal relief pad is increased based on the length of the pair of mutually opposite conductive bands in the direction perpendicular to a direction of the return current to the at least one reference plane.

9. The PCB as claimed in claim 5, wherein an area of reference plane continuity formed by two adjacent thermal relief pad is increased based on the length of conductive bands of each of the two adjacent thermal relief pads in the direction perpendicular to the direction of the return current to the at least one reference plane.

10. The PCB as claimed in claim 5, wherein a noise margin of the plurality of the components mountable on the at least one conductive layer is increased based on the path of lower inductance for the return current to the at least one reference plane.

11. The PCB as claimed in claim 1, the PCB being employed for high speed data transfer.

12. The PCB as claimed in claim 11, the PCB being employed in one of a double data rate fourth rate synchronous dynamic random-access memory (DDR4 SDRAM) and Peripheral Component Interconnect Express (PCIe).

* * * * *